(12) United States Patent
Ito et al.

(10) Patent No.: US 8,987,650 B2
(45) Date of Patent: Mar. 24, 2015

(54) FRONT END MODULE FOR OPTICAL RECEIVER

(75) Inventors: Makoto Ito, Yokohama (JP); Sosaku Sawada, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 697 days.

(21) Appl. No.: 13/227,512

(22) Filed: Sep. 8, 2011

(65) Prior Publication Data

US 2012/0070121 A1     Mar. 22, 2012

(30) Foreign Application Priority Data

Sep. 22, 2010   (JP) ................. P2010-212483

(51) Int. Cl.
*G02B 6/36*     (2006.01)
*H01L 31/02*    (2006.01)
*H03F 3/08*     (2006.01)

(52) U.S. Cl.
CPC .......... *H01L 31/02019* (2013.01); *H03F 3/087* (2013.01)
USPC ..................................... 250/214 A

(58) Field of Classification Search
CPC ................ H01L 31/02019; H04B 2210/003; H04B 10/291
USPC ..................................... 250/214 A
See application file for complete search history.

(56) References Cited

U.S. PATENT DOCUMENTS

| 5,933,264 A | 8/1999 | Van Der Heijden |
| 2006/0078269 A1 | 4/2006 | Baek |
| 2012/0070121 A1* | 3/2012 | Ito et al. ............... 385/88 |
| 2012/0261553 A1* | 10/2012 | Elkind et al. ............ 250/208.1 |
| 2012/0298844 A1* | 11/2012 | Itamoto et al. ........... 250/214 A |

FOREIGN PATENT DOCUMENTS

| CN | 1217107 A | 5/1999 |
| CN | 1758569 A | 4/2006 |
| JP | 2007-274032 | 10/2007 |

OTHER PUBLICATIONS

U.S. Appl. No. 13/093,283, Takechi.
Chinese Office Action for Chinese counterpart application No. 201110283883.8, dated Jan. 6, 2014.

* cited by examiner

*Primary Examiner* — Tony Ko
(74) *Attorney, Agent, or Firm* — Smith, Gambrell & Russell LLP

(57) ABSTRACT

A front end module for an optical receiver is disclosed. The module includes a PD, a trans-impedance amplifier (TIA), an insulating carrier for mounting the PD, and a conductive base for mounting the carrier. The carrier provides first and second metal films thereon. The first metal film carries a photocurrent from the PD to the TIA, while, the second metal film carries the bias supply to the PD. The PD is mounted on the first and second metal films by the flip-chip arrangement. The second metal film surrounds the first metal film to suppress resonances appeared in the trans-impedance spectrum of the front end module.

17 Claims, 16 Drawing Sheets

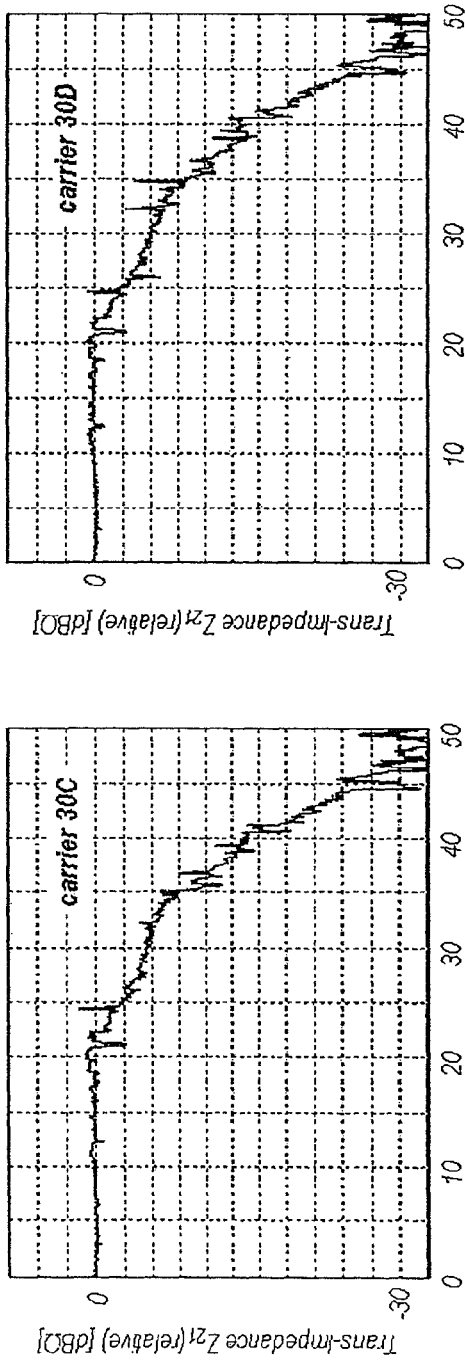
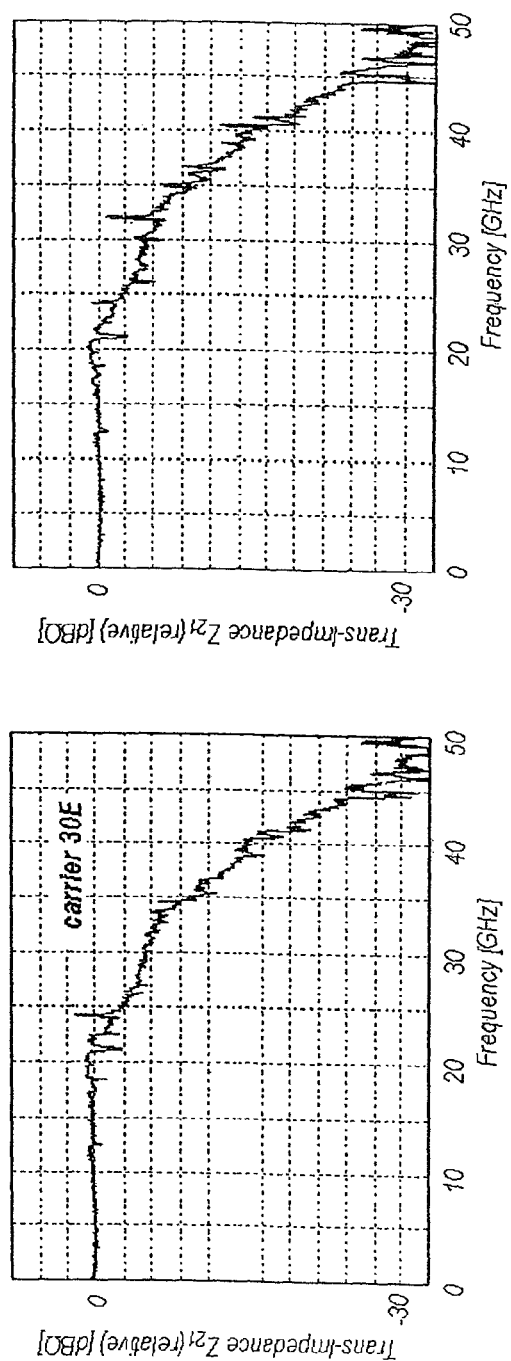

FRONT END MODULE FOR OPTICAL RECEIVER

BACKGROUND OF THE INVENTION

1. Field of the Invention

The present invention relates to a front end module for an optical receiver, in particular, the present invention relates to a module including a photodiode (hereafter denoted as PD) mounted on a carrier.

2. Related Background Art

A front end module for an optical receiver generally includes a PD that receives an optical signal to generate a photocurrent and a trans-impedance amplifier (hereafter denoted as TIA) that converts the photocurrent into a voltage signal. A Japanese Patent Application published as JP-2007-274032A has disclosed such a front end module. The transmission speed of the optical communication has increased and exceeded over 10 GHz in some applications. The front end module is necessary to operate stably even in such high transmission speeds.

SUMMARY OF THE INVENTION

The present invention relates to a front end module of an optical receiver. The module according to one embodiment of the invention comprises a light-receiving device such as a PD, a TIA, a carrier made of electrically insulating material and a base made of electrically conductive material. The light-receiving device may generate a photocurrent provided with a bias supply. The TIA may have a ground and receive the photocurrent from the PD through a first bonding wire. The carrier mounts the light-receiving device thereon. Specifically, the carrier includes first to third metal films. The first metal film connects the PD with the first bonding wire to carry the photocurrent. The second metal film, which surrounds the first metal film, carries the bias supply to the light-receiving device. The third metal film is arranged outside of the second metal film with respect to the third metal film. The first and second metal films mount the light-receiving device thereon by the arrangement of the flip-chip bonding. The base mounts the carrier and the TIA thereon. The arrangement according to the present invention has a feature that the third metal film is floated from the ground and connected to the second metal film by a resistor to constitute a series circuit of the resistor and a capacitor attributed to the third metal film against the base. Such an arrangement may show a function that resonances appeared in the frequency response of the trans-impedance of the front end module are suppressed or substantially vanish in a frequency region over 20 GHz with maintaining the flatness of the response in a lower frequency region below 20 GHz.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified.

FIGS. 14A to 14D show behaviors of the trans-impedance $Z_{21}$ obtained from the modified arrangements shown in FIG. 13;

DESCRIPTION OF THE PREFERRED EMBODIMENTS

Figure 1:
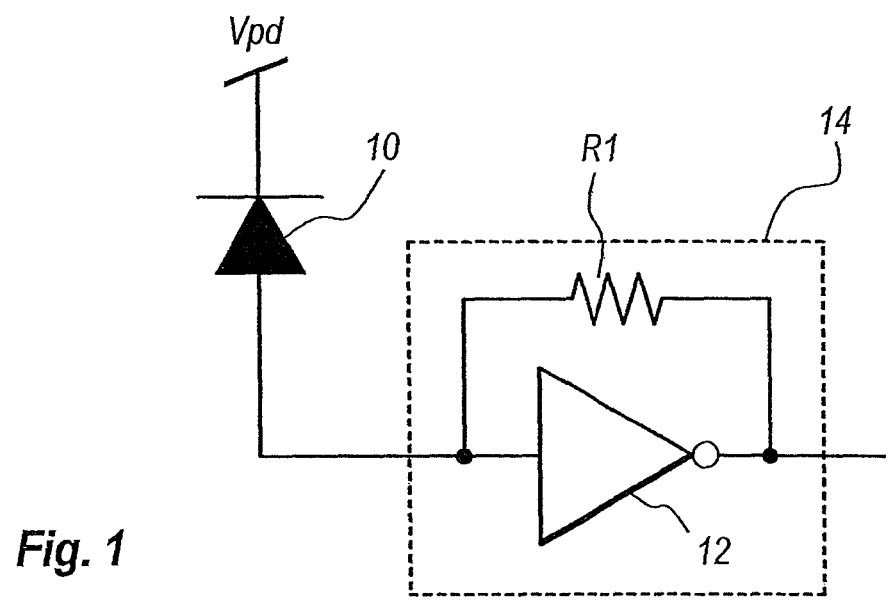
FIG. 1 shows an ideal circuit diagram of a front end module without taking any parasitic elements into account.

First, an optical receiver will be described. FIG. 1 is a circuit diagram of an ideal optical receiver that ignores parasitic circuit elements; in particular, FIG. 1 is a front end circuit implemented within an optical receiver. The circuit shown in FIG. 1 includes a PD 10 and a TIA 14. The PD converts an optical signal into a photocurrent supplied by the bias supply Vpd in the cathode electrode thereof; while, the TIA 14, which is connected in the anode of the PD, converts the photocurrent into a voltage signal. The TIA includes an inverting amplifier 12 and a trans-impedance element R1, where the trans-impedance element R1 is a pure resistor in FIG. 1 but not restricted to the pure resistor. The optical receiver may generally further include a main amplifier and the like in the downstream of the TIA.

Figure 2A:
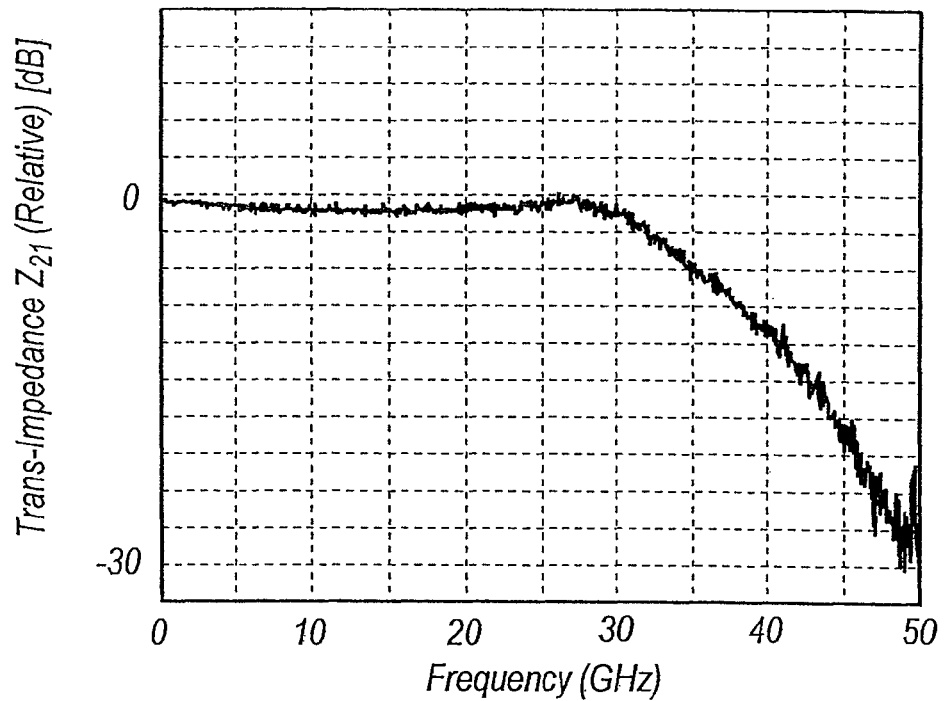
FIGS. 2A and 2B show a frequency response of the trans-impedance $Z_{21}$ and the one of S-parameters $S_{22}$ of the circuit, shown in FIG. 1, respectively.
Figure 2B:
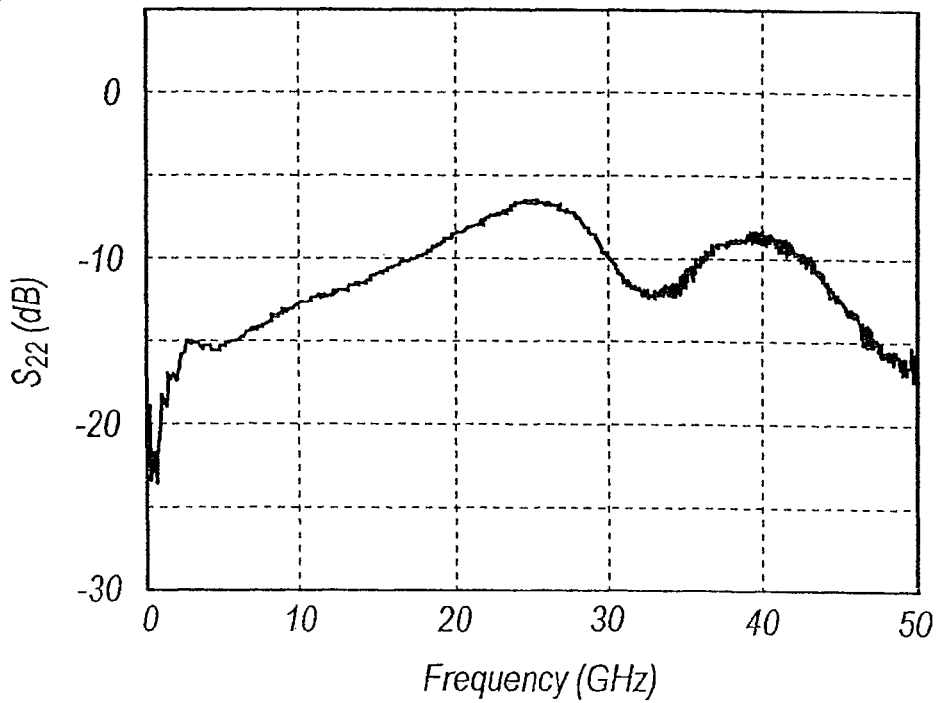

A distinguishable TIA will be described, in which the TIA may be comprised of transistors having an arrangement of, what is called, the hetero-structure bipolar transistor (HBT) primarily made of InP based materials. The InP based material includes InP itself and compound semiconductor materials substantially lattice matching to InP, or compound semiconductor materials capable of growing on an InP substrate. FIGS. 2A and 2B show the frequency behavior of the trans-impedance $Z_{21}$ and one of S-parameters $S_{22}$ of the TIA constituted by the InP-HBTs. The trans-impedance $Z_{21}$, which is measured by a ratio of the output voltage of the TIA to the input current and has the dimension of the resistance, shows a nearly flat response up to about 30 GHz then gradually decreases over 30 GHz. The S-parameter $S_{22}$ shows less than −10 dB in almost whole frequencies. These behaviors shown in FIGS. 2A and 2B assumes no parasitic circuit elements and only shows the primary performance of the TIA comprised of the InP HBTs.

Figure 3A:
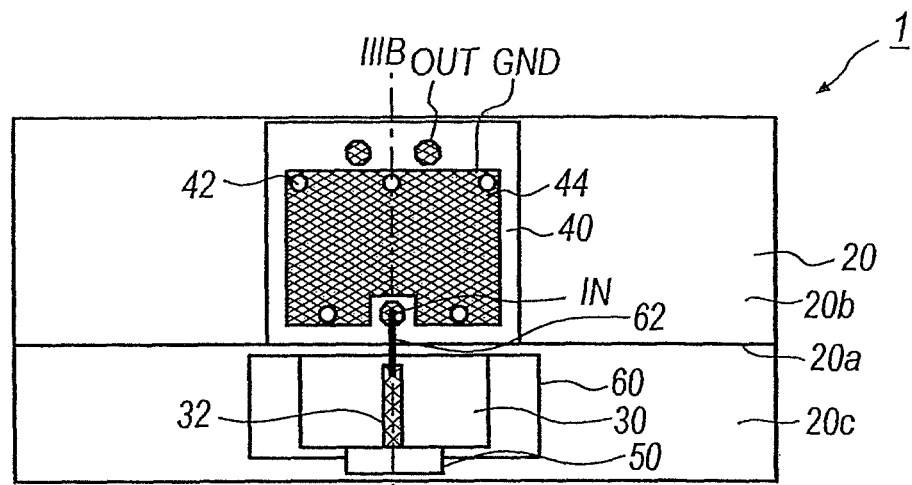
FIGS. 3A to 3C are a plan view, a side cross sectional view, and a front view, respectively, of a front end module according to a comparative example of the invention.
Figure 3B:
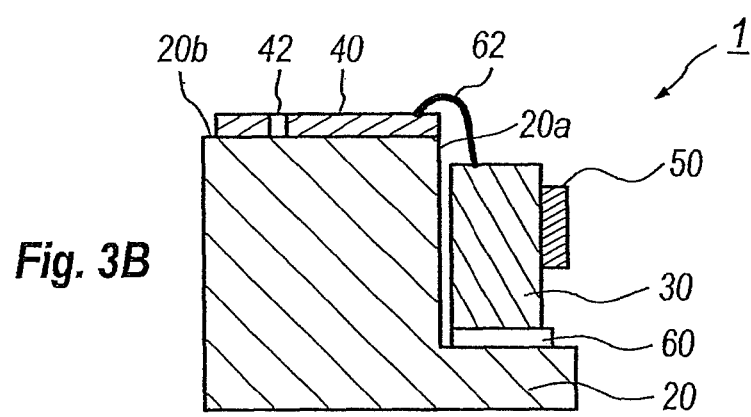
Figure 3C:
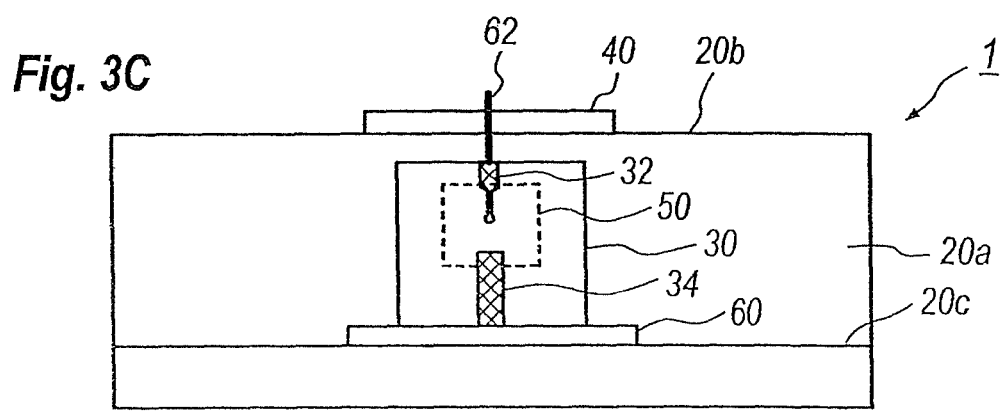

FIGS. 3A to 3C show a front end module 1 of an optical receiver including a PD 10 and a TIA 14. FIG. 3A is a plan view, FIG. 3B is a cross section taken along the line IIIB-IIIB in FIG. 3A, and FIG. 3C is a front view. The front end module 1 further includes the base 20 and a carrier 30. The base 20 has a front step 20a with a top 20b and bottom 20c, where the carrier 30 is mounted on the bottom 20c of the step 20a. The base 20 may be made of electrically conductive material such as an alloy of iron (Fe) and nickel (Ni); while, the carrier 30 may be made of insulating material such as aluminum oxide ($Al_2O_3$). A capacitor 60 is put between the bottom 20c of the step 20a and the carrier 30. An IC 40, which integrates the TIA 14 therein with interconnections 44 including electrical pads IN for the input, pads OUT for the output, and the ground GND, may be directly mounted on the top 20b of the front step 20a. The ground GND on the top surface of the IC 40 is grounded to the top 20b of the front step 20a through via holes 42 filled with a metal that pass from the top surface to the bottom surface of the IC 40. Although FIG. 3A explicitly shows via holes 42, the ground GND covers the top of the via holes 42 in the practical module.

The carrier 30 has first and second metal films, 32 and 34 in top and side surfaces thereof. A bonding wire 62 may connect the first metal film 32 with the input pad IN of the IC 40; while, the second metal film 34 is directly connected to the capacitor 60. The capacitor 60 also has a bonding pad, which is not explicitly illustrated in FIGS. 3A to 3C, to which the bias supply Vpd is provided.

The carrier 30 may mount the PD chip 50 that includes the PD 10. Specifically, the PD chip 50 mounted on the front side surface of the carrier 30 by an arrangement of the flip-chip bonding. The PD chip 50 is denoted by a broken line in FIG. 3C. The cathode electrode of the PD chip 50 is directly connected with the first metal film 32, while, the anode electrode of the PD chip 50 is also directly connected with the second metal film 34.

Figure 4:
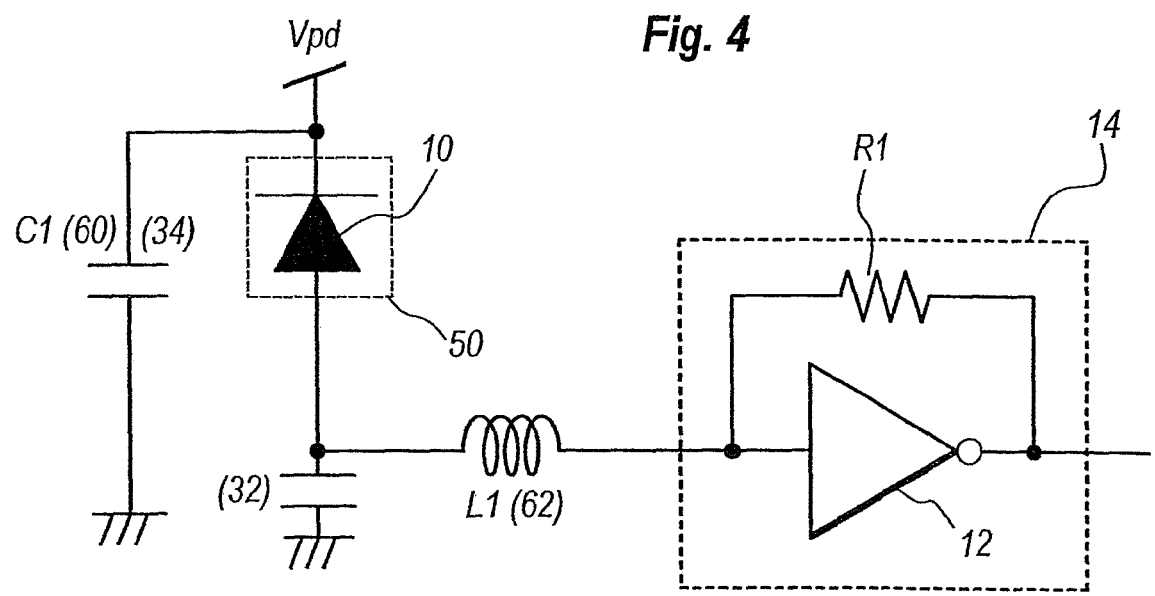
FIG. 4 shows a circuit diagram including parasitic elements of the front end module according to the comparative example shown in FIG. 3.

FIG. 4 is a circuit diagram of the front end module 1 shown in FIGS. 3A to 3C. The circuit includes the PD 10 formed within the PD chip 50 and a TIA 14 formed within the IC 40. The TIA 14 includes an inverting amplifier 12 and a trans-impedance R1 connecting the input to the output of the inverting amplifier 12. The circuit shown in FIG. 4 also includes an inductor L1 put between the PD 10 and the TIA 14 and capacitors C1 and else. The inductor L1 reflects the parasitic inductor of the bonding wire 62. While, the capacitor C1 connected to the cathode of the PD 10 corresponds to the capacitor 60 put between the carrier 30 and the bottom 20c of the front step 20a of the base 20 and a parasitic capacitance attributed to the metal film 34 against the base 20. The other capacitor connected to the anode of the PD 10 corresponds to a parasitic capacitor attributed to first metal film 32 against the base 20.

Figure 5A:
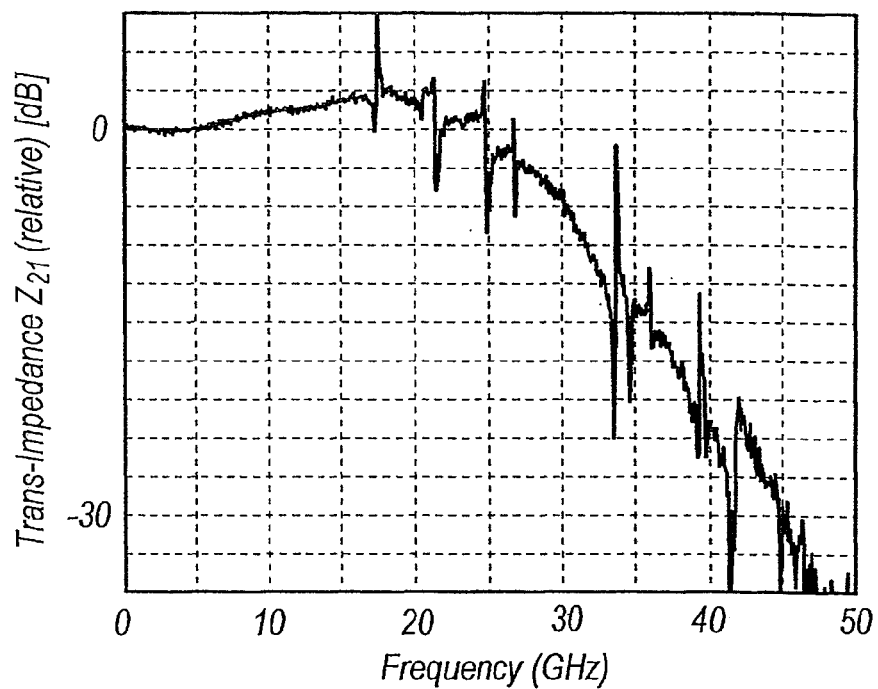
FIGS. 5A and 5B show behaviors of the trans-impedance $Z_{21}$ and the S-parameter $S_{22}$ of the front end module shown in FIG. 3.
Figure 5B:
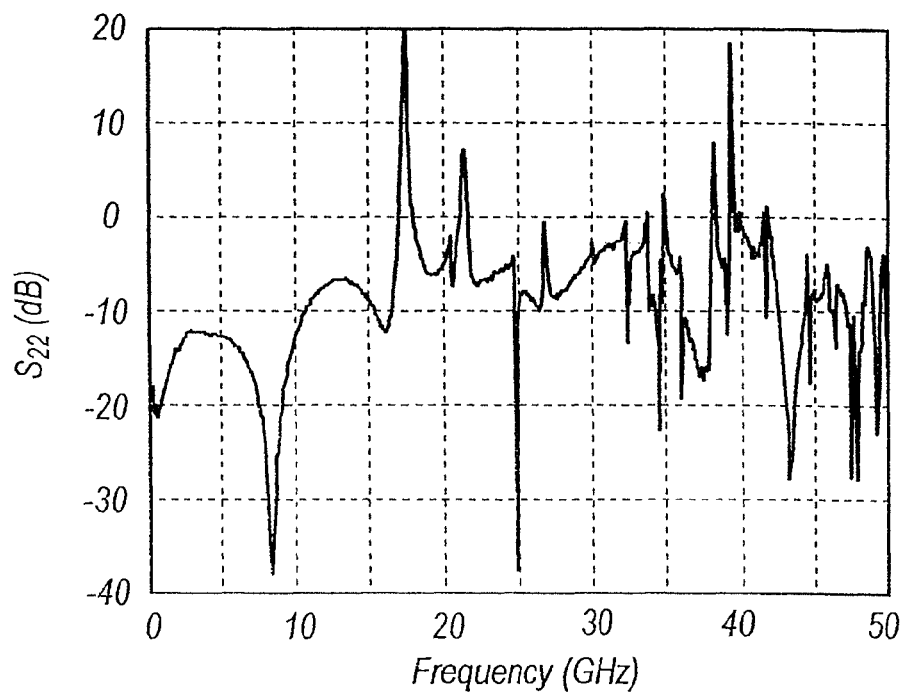

FIGS. 5A and 5B are the calculated results of the frequency response of the trans-impedance $Z_{21}$ and the S-parameter $S_{22}$ of the front end module 1 shown in FIG. 4. The calculation includes a contribution of a current flowing in the bonding wire 62 and another current output from the TIA 14, and parasitic capacitances inherently attributed to metal films on the carrier 30 against the base 20. The behaviors in FIGS. 5A and 5B clearly show many resonances in a region exceeding 8 GHz. One reason of the resonances is seemed to be an interaction of the magnetic flux caused by the output current of the TIA 14 on the carrier 30. Specifically, a current flowing in a bonding wire that connects the output pad OUT to an amplifier set in the down stream of the module 1 influences the photocurrent coming in the input pad IN of the IC 40 carried on the ground GND, which may fluctuate the signal propagating on the metal film 32 on the carrier 30.

Figure 6:
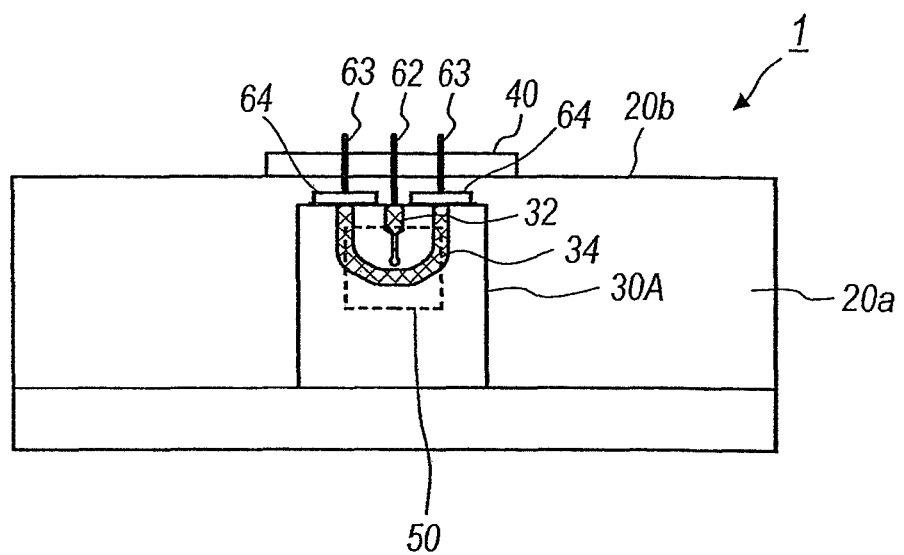
FIG. 6 is a front view of another comparative example of the invention.
Figure 7:
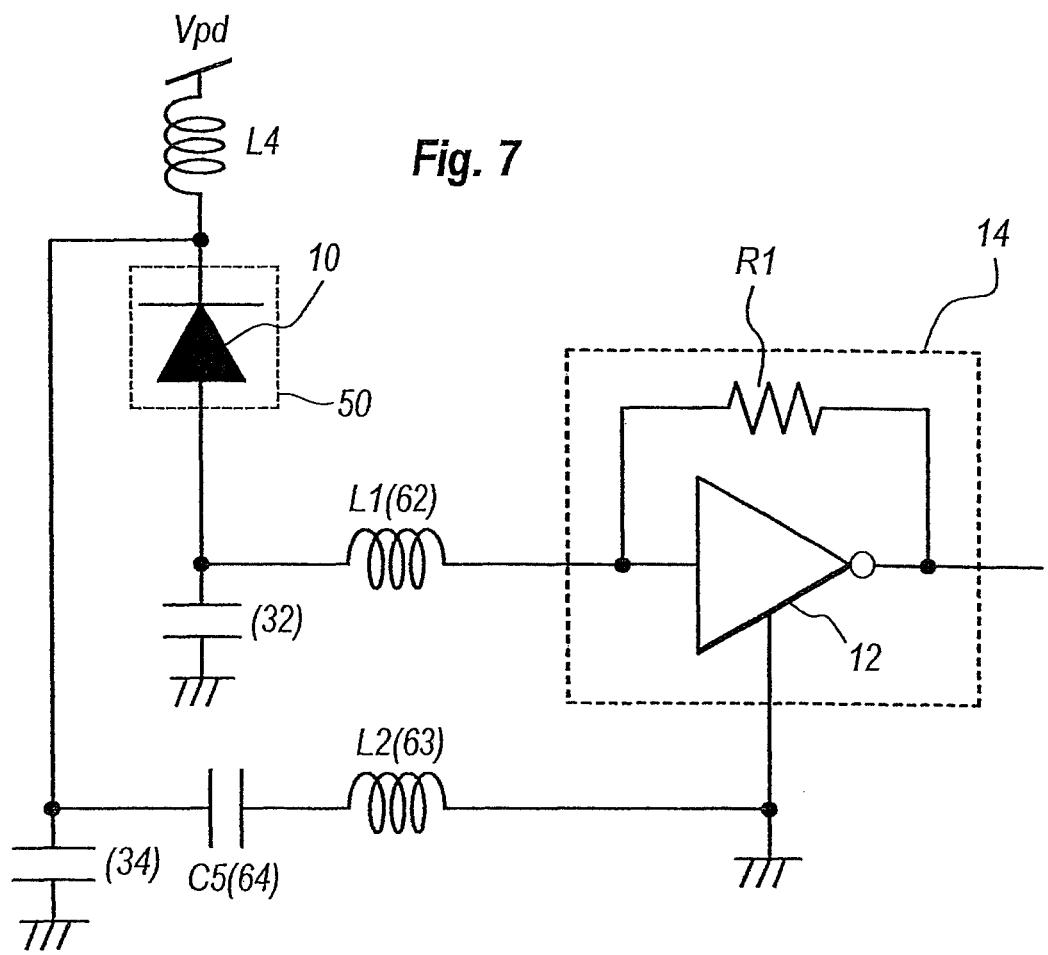
FIG. 7 is a circuit diagram including parasitic elements of the front end module according to the other comparative example shown in FIG. 6.
Figure 8:
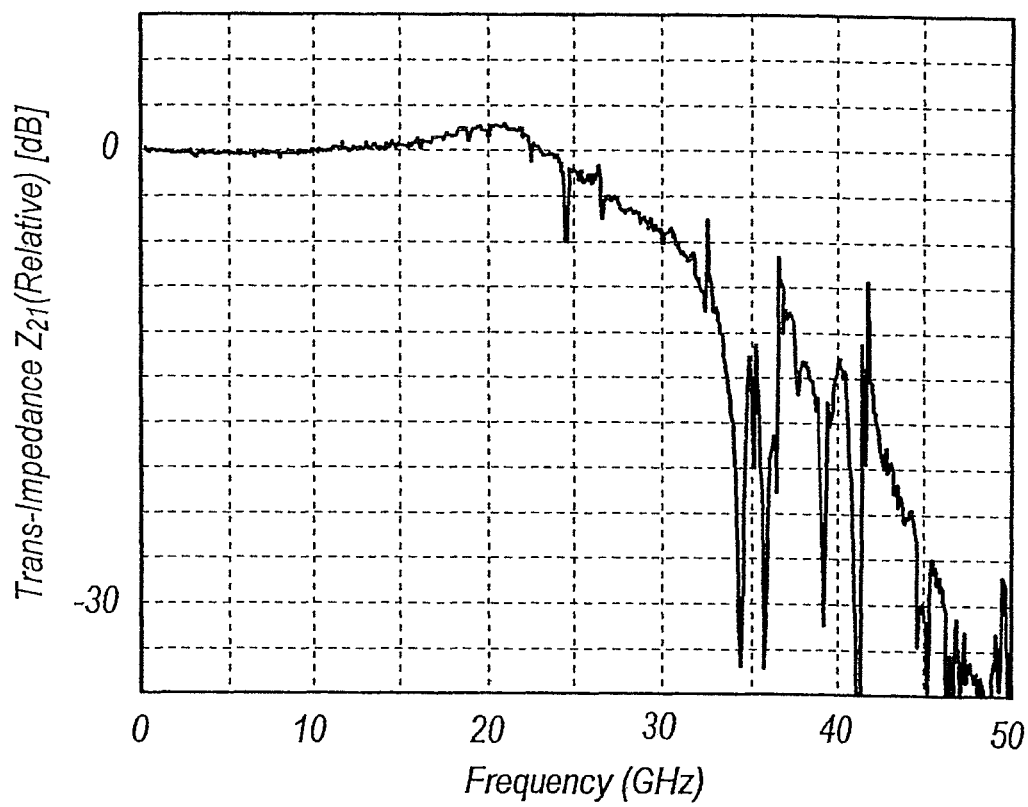
FIG. 8 shows a behavior of the trans-impedance $Z_{21}$ of the other comparative example of the front end module shown in FIG. 6.

FIG. 6, which is a front view of the front end module 1, shows one solution to suppress the resonances. The cathode of the PD 10 is directly connected to the first metal film 32, but the first metal film 32 accompanied with the cathode electrode of the PD chip 50 may be surrounded by the second metal film 34, and the second metal film 34 in both ends thereof is connected with the ground GND of the TIA chip 40 through bonding wires 63 and a capacitor. That is, the second metal film 34 extends on the top of the carrier 30A and mounts a die capacitor 64 thereon, where the top electrode of the die capacitor 64 is wire-bonded to the ground GND of the IC 40 by the bonding wire 63. FIG. 7 is a circuit diagram of the module 1 shown in FIG. 6. The circuit shown in FIG. 7 includes, in addition to those shown in FIG. 4, another inductor L2 put between the cathode of the PD 10 and the ground GND, the die capacitor 64 and parasitic capacitors attributed to the metal films, 32 and 34. The inductor L2 corresponds to the parasitic inductor of the bonding wire 63 connecting the die capacitor 64 with the ground GND on the IC 40. The circuit shown in FIG. 7 further includes an inductor L4, which means that the bias supply Vpd is externally supplied through the supply line having the parasitic inductance L4. FIG. 8 shows the frequency response of the trans-impedance $Z_{21}$ shown in FIGS. 6 and 7. The resonances appeared in a region less than 30 GHz in FIG. 5A substantially vanish. This is because the second metal film 34, the bonding wire 63, and the ground GND on the IC 40 forms a loop to shield the metal film 32 that carries the photocurrent from the PD 10 to the TIA 14. However, the trans-impedance $Z_{21}$ shown in FIG. 8 leaves some resonances in a region over 30 GHz. Accordingly, only the second metal film 34 surrounding the first metal film 32 on the surface of the carrier 30 is insufficient to operate the front end module 1 in frequencies higher than 30 GHz.

Figure 9A:
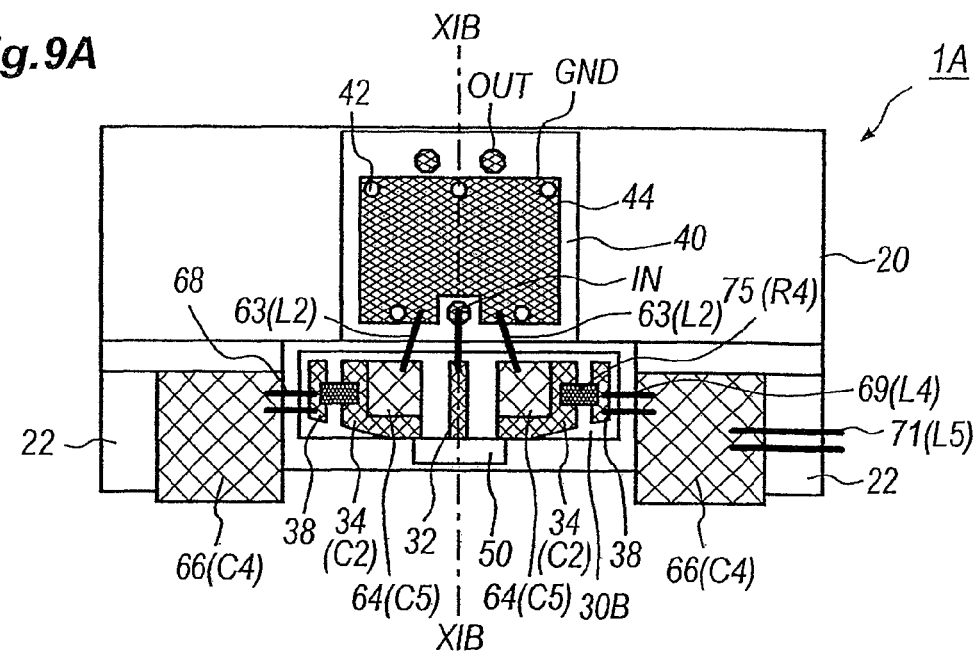
FIGS. 9A to 9C show the plan view, the side cross section, and the front view, respectively, of the front end module according to one embodiment of the invention.
Figure 9B:
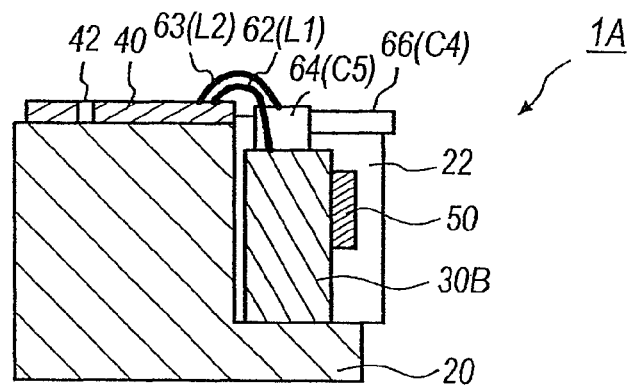
Figure 9C:
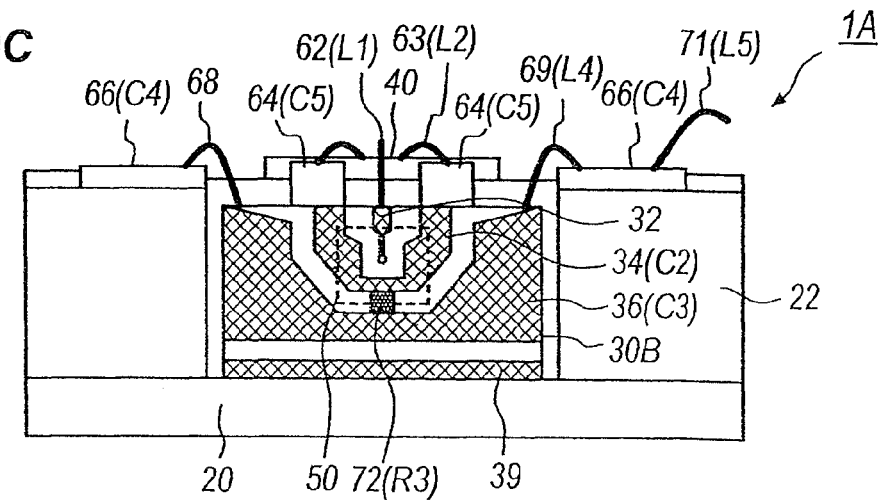

FIGS. 9A to 9C show an embodiment according to the present invention, specifically, FIG. 9A is a plan view, FIG. 9B is a cross section taken along the line XIB-XIB, and FIG. 9C is a front view of the module 1A. The PD chip 50 is also marked by the broken line in FIG. 9C. The carrier 30B includes a plurality of metal films, 32 to 39, on the front and top surfaces thereof. The first metal film 32 is provided on the top and front side surfaces of the carrier 30B, where the PD chip 50 is directly mounted on the first metal film 32 in the front side surface so as to connect the anode pad thereof with the end of the first metal film 32 by, for instance, the bump electrode. The first metal film 32 on the top of the carrier 30B is wire-bonded to the input pad IN of the IC 40. The second metal film 34 is also formed on the top and front side surfaces of the carrier 30B. The cathode electrode of the PD chip 50 is directly connected with the second metal film 34 in the front end surface of the carrier 30B. The second metal film 34 has a U-shape so as to surround the first metal film 32; while, it is divided into two portions in the top surface of the carrier 30B, where each of metal films 34 put the first metal film 32 therebetween and mount respective die-capacitors 64 thereon by the soldering. One surface of the die capacitor 64 faces and directly comes in contact with the second metal film 34, while, the top surface of the die capacitor 64 is wire-bonded to the ground GND on the IC 40.

The third metal film 36 is connected with the second metal film 34 only through a resistor 72 at a bottom portion of the U-shaped second metal film 34. The front surface of the carrier 30B also provides another metal film 39 at a bottom of the carrier 30B. The metal film 39 is electrically connected to the base 20 to provide the ground. The top surface of the carrier 30B provides the fourth metal films 38 in both outer sides of the second metal film 34. The fourth metal film 38 is connected with the second metal film 34 through a resistor 75.

The front end module 1 shown in FIGS. 9A to 9C further includes two sub-bases 22 putting the carrier 30B therebetween. Although the embodiment shown in figures physically divides the sub-base 22 from the carrier 30B, the carrier 30B may integrally form the sub-base 22, or may braze them. The sub-base 22 mounts the die capacitor 66 thereon fixed by soldering. The die capacitor 66 on the sub-base 22 may be wire-bonded with the bias supply Vpd through the bonding wire 71 and the fourth metal film 38 on the top of the carrier 30B through another boding wire 69.

The base 20 and the sub-base 22 may be made of metal alloy of iron (Fe) and nickel (Ni), but not limited to those materials. The carrier 30B may be made of aluminum oxide ($Al_2O_3$), but not limited to this material. The metal films, 32 to 39, may be made of gold (Au) thin film but not restricted to gold. The resistors, 72 and 75, may have a form of a thin film resistor made of tantalum nitride (TaN), but not restricted to this material.

Figure 10:
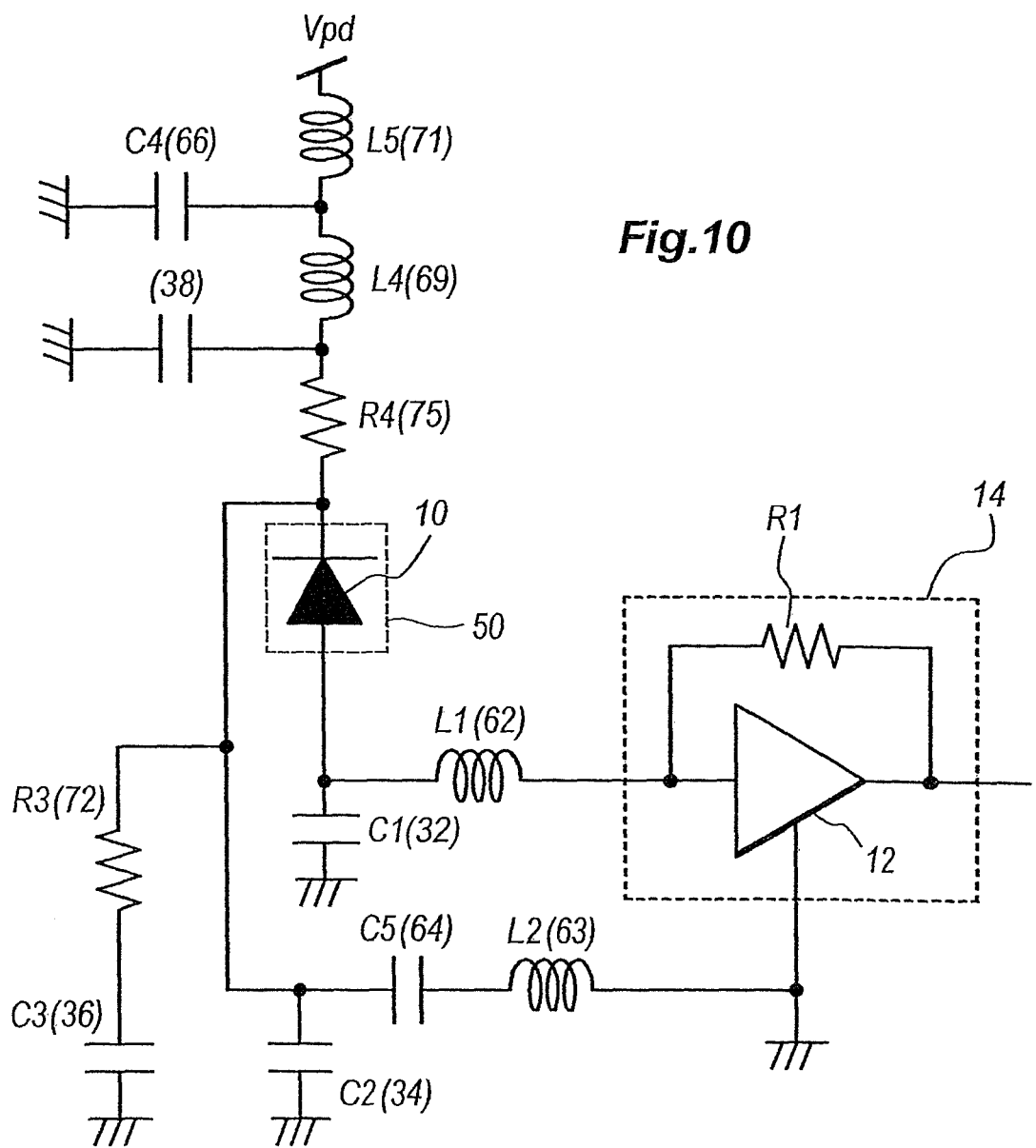
FIG. 10 is a circuit diagram including parasitic elements of the front end module of the embodiment shown in FIG. 9.

FIG. 10 shows an equivalent circuit of the front end module 1A shown in FIGS. 9A to 9C, including parasitic circuit elements inherently accompanied with the metal films, 32 to 38. The cathode of the PD 10 is biased by the power supply Vpd through a series circuit of a resistor R4, an inductor L4, and another inductor L5. The capacitor C4 is connected between a common node of two inductors, L4 and L5, and the ground, and another capacitor C5 is put between the inductor L2 and the cathode of the PD 10, where these capacitors, C4 and C5, are the die capacitor. The capacitor C1 reflects the parasitic capacitor attributed to the first metal film 32 against the base 20, while, the capacitor C2 reflects the parasitic capacitor inherently attributed to the metal film 34 on the carrier 30B against the base 20. The resistor R3 is the thin film resistor 72, while the capacitor C3 reflects the parasitic capacitor attributed to the third metal film 36 against the base 20. The resistor R4 is the thin film resistor 75 on the top of the carrier 30B. The inductor L4 reflects the parasitic inductance of the bonding wire 69, while, the inductor L5 reflects the parasitic inductance of the bonding wire 71.

In an arrangement where the back surface of the carrier 30B makes close to the front step 20a of the base 20 in FIG. 9B but whit a substantial air gap, the capacitors, C2 and C3, include a parasitic capacitance formed between the metal film 34 and the front step 20a of the base 20 interposing the insulating carrier 30B and an air between the base 20 and the carrier 30B. In another arrangement where the back surface of the carrier 30B is coated with a metal electrically connected to the base 20, the parasitic capacitors, C2, C3 and 32, attributed to the metal films, 32 to 26, may be constituted by two metal films putting the insulating carrier 30B therebetween so as to form a parallel plate arrangement. In the latter arrangement of the parasitic capacitor, the capacitance thereof may be greater than the capacitance given by the former arrangement; accordingly, the latter arrangement sometimes causes subjects to degrade the frequency response of the module 1A even in lower frequencies.

Figure 11A:
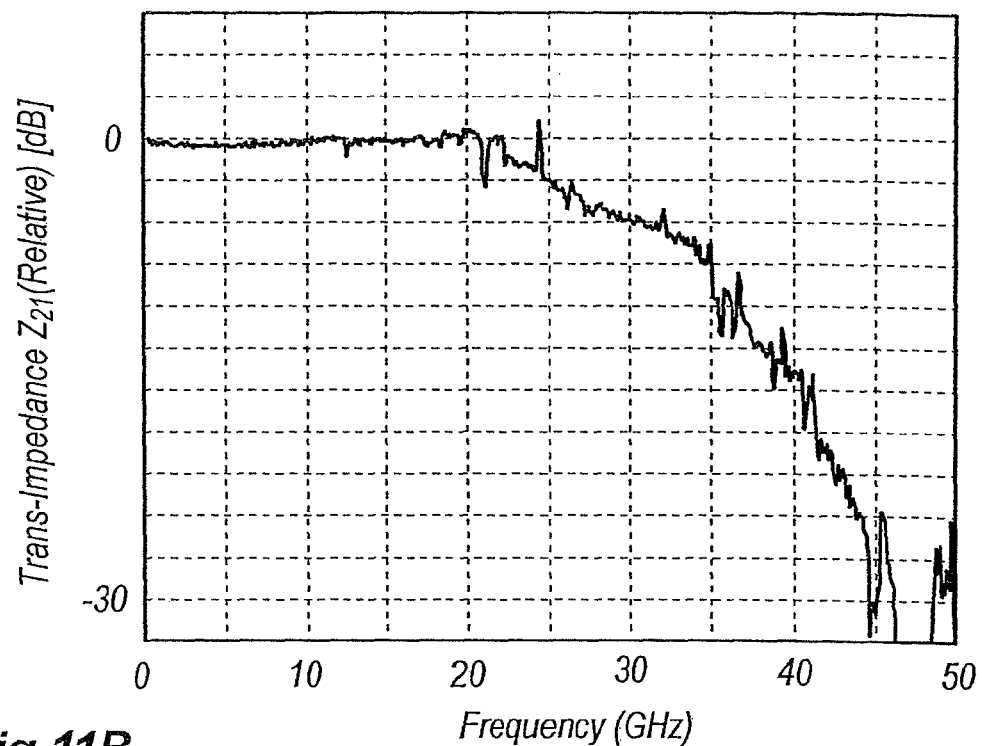
FIGS. 11A and 11B show behaviors of the trans-impedance $Z_{21}$ and the S-parameter $S_{22}$, respectively, of the front end module shown in FIG. 9.
Figure 11B:
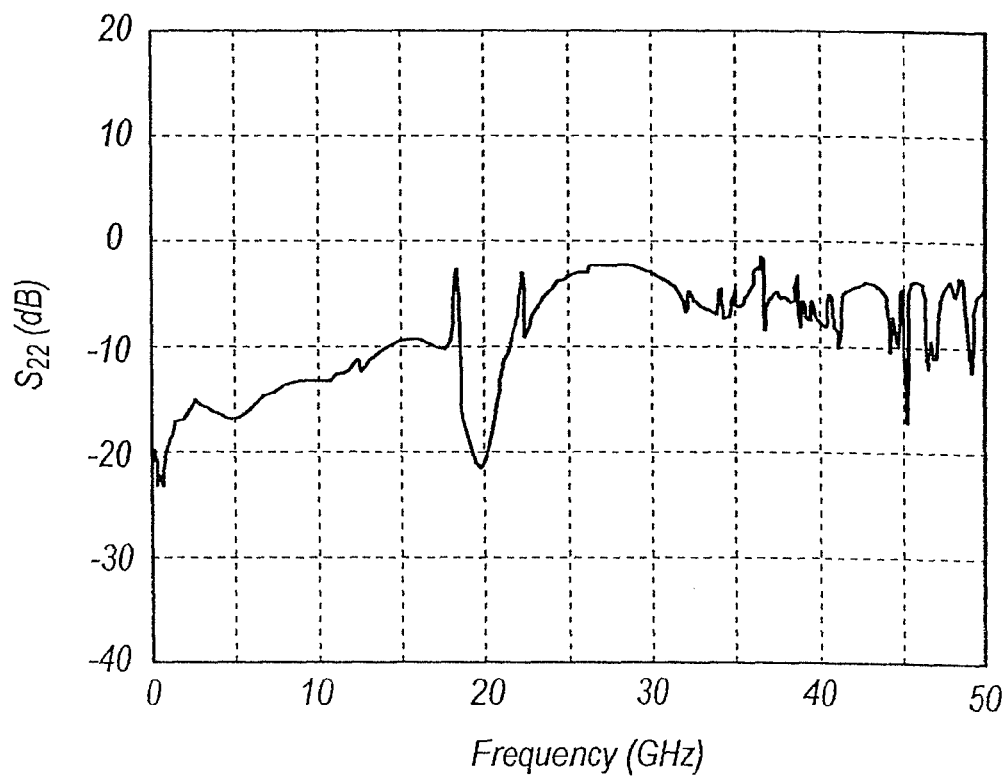

FIGS. 11A and 11B show the frequency response of the trans-impedance $Z_{21}$ and the S-parameter $S_{22}$ of the front end module 1B shown in FIGS. 9A to 9C. The carrier 30B has a height and a width of 1.0 and 1.5 mm, respectively, and a length of 0.4 mm. According to this arrangement, the capacitance of the capacitors, C2 to C5 are assumed to be 30 fF, 53.5 fF, 100 pF, and 10 pF, respectively. The resistance of the resistors, R3 and R4, are each set to be 50 Ω. Lastly, the inductance of the inductors, L1, L2 and L4, as a bonding wire are assumed to be all 0.2 nH.

As shown in FIGS. 11A and 11B, resonances in an extremely high frequency region up to 50 GHz substantially vanish without disturbing the flatness in lower frequencies less than 20 GHz. Moreover, the S-parameter $S_{22}$ is kept less than −10 dB in the low frequency region.

Figure 12A:
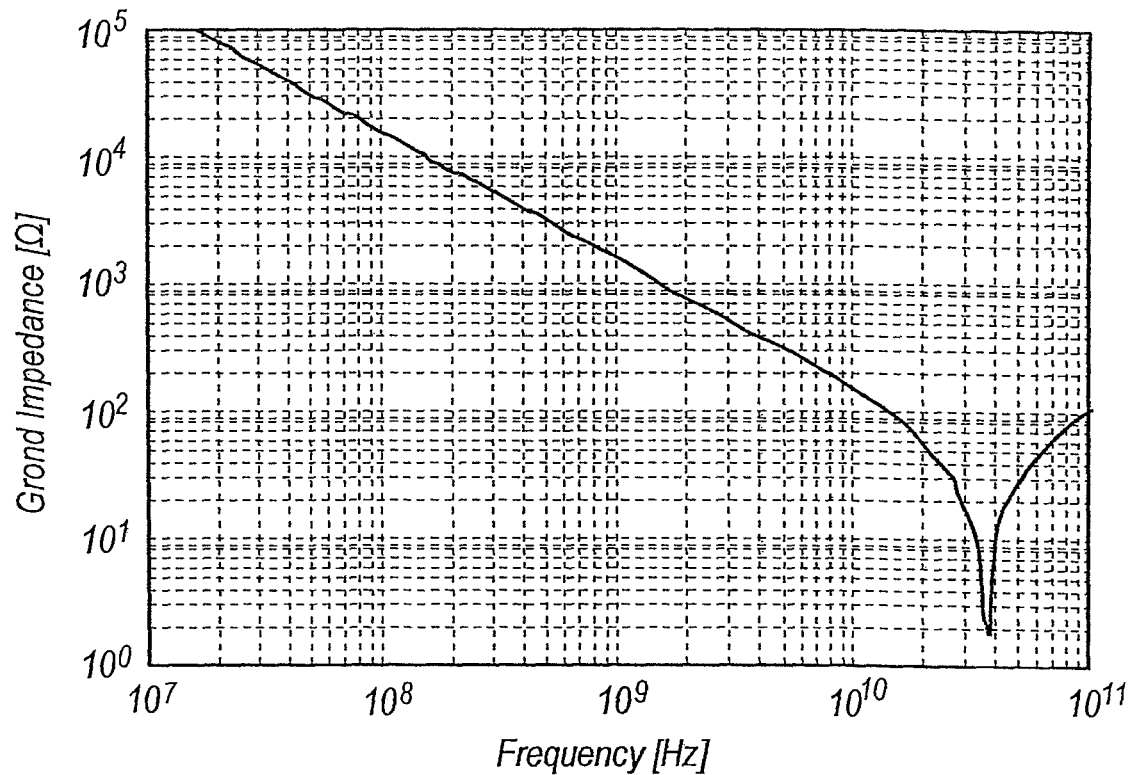
FIGS. 12A and 12B compare the efficiency of the series circuit of a resistor and a third metal film according to the embodiment of the invention.

A mechanism to suppress resonances appeared in high frequencies over 30 GHz will be described. As already explained in FIG. 8, only the second metal film 34 to provide the bias supply to the PD 10 surrounding the first metal film 32 to carry the photocurrent is insufficient to suppress the resonances in frequencies over 30 GHz. This means that even the second metal film 34 is affected by the current output from the TIA 14 to the downstream amplifier. FIG. 12A shows the ground impedance viewed from the ground GND of the TIA 14 toward the carrier 30A. Referring to FIG. 7, the ground impedance includes circuit elements of the inductor L2, the capacitor C5, and the parasitic capacitor 34. The capacitor C5 and the bias supply Vpd may be short-circuited in higher frequencies; accordingly, the ground impedance depends of the inductor L2 and the capacitor 34 connected in series to the others, which causes the sharp resonance at about 35 GHz as shown in FIG. 12A.

Figure 12B:
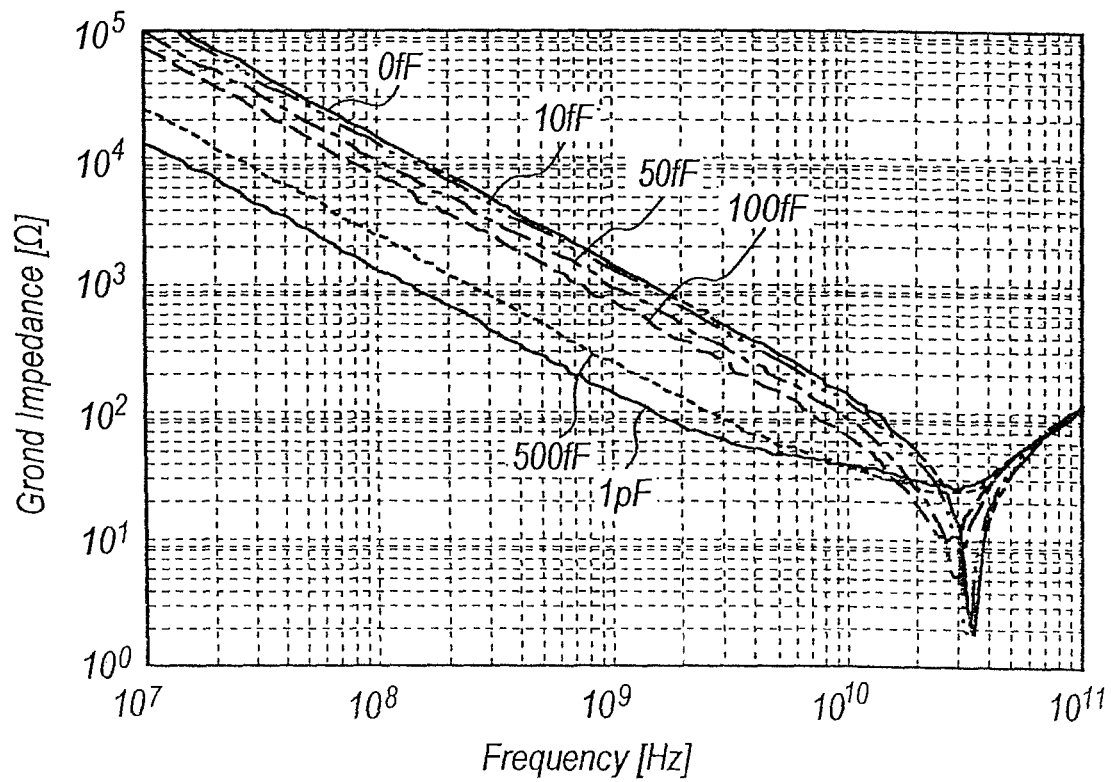

FIG. 12B shows the ground impedance when the series circuit of the resistor R3 and the capacitor C3 is connected to the second metal film 34. As shown in FIG. 12B, the additional series circuit according to the present embodiment may dull the resonance appeared around 35 GHz. In particular, when the capacitance C3 attributed to the third metal film 36 has the capacitance greater than 500 fF, the resonance almost vanishes. Even the capacitor C3 has the capacitance of 50 fF, the resonance becomes dull and the behavior of the trans-impedance $Z_{21}$ and the s-parameter $S_{22}$, as shown in FIGS. 11A and 11B, may suppress the resonances appeared in higher frequencies over 30 GHz.

Some modifications of the carrier 30B, in particular, the shape of the second and third metal films, 34 and 36, will be described.

Figure 13A:
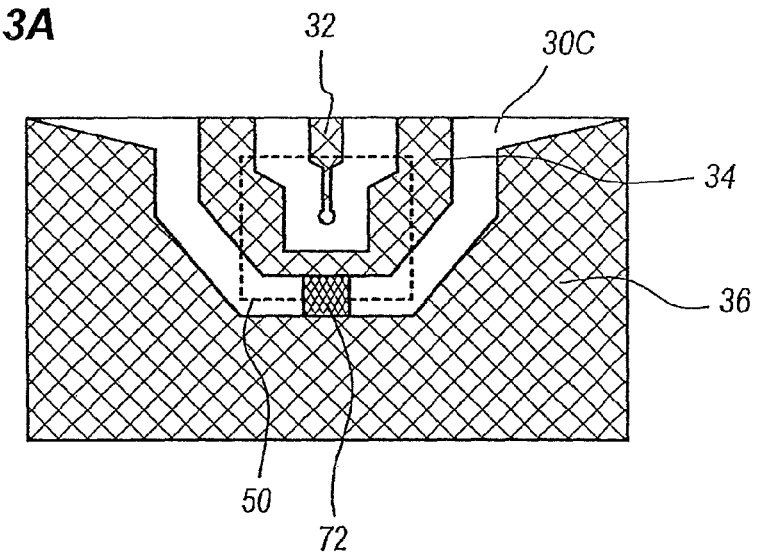
FIGS. 13A to 13C show modified arrangements of the resistor and the third metal film of the invention.

FIG. 13A is a front view showing the carrier 30C modified from the aforementioned carrier 30B. The modified carrier 30C, compared with the arrangement shown in FIG. 9C, removes the additional metal film 39 but the third metal film 36 extends to the bottom edge of the carrier 30C. However, the third metal film 36 is electrically isolated from the bottom 20c of the base 20; that is, the third metal film 36 is slightly apart from the bottom edge of the carrier 30C. The third metal film 36 shows capacitance of about 80 fF against the base 20, which may be reflected to the capacitor C3 in FIG. 10.

Figure 13B:
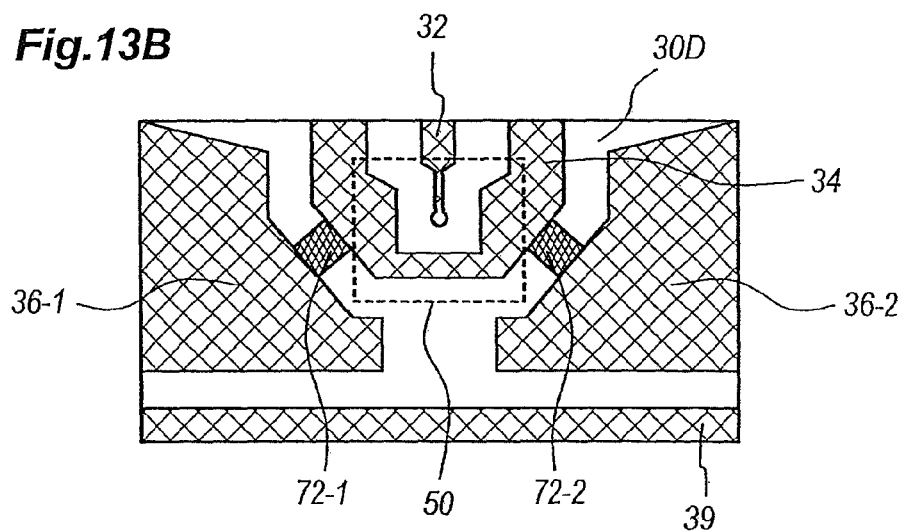

FIG. 13B shows another carrier 30D modified from those shown in FIG. 9C. Comparing with the arrangement of FIG. 9C, the carrier 30D divides the third metal film 36 into two parts, 36-1 and 36-2, putting the metal film 34 therebetween and each connected with the metal film 34 through film resistors, 72-1 and 72-2. This arrangement shown in FIG. 13B may divide the capacitor C3 in the circuit diagram of FIG. 10 into two capacitors, C3-1 and C3-2, each showing capacitance of about 49.4 fF against the base 20. The film resistors, 72-1 and 72-2, each has resistance of 100 Ω which is twice of resistance of the resistor 72 shown in FIG. 9C. Other arrangements of the carrier 30D follow those shown in FIG. 9C. The capacitor, C3-1 or C3-2, having respective capacitance greater than the capacitance C2 attributed to the metal film 34 may dull the resonance appeared around 30 GHz. Both third metal films, 36-1 and 36-2, may show the capacitance greater than that attributed to the metal film 34.

Figure 13C:
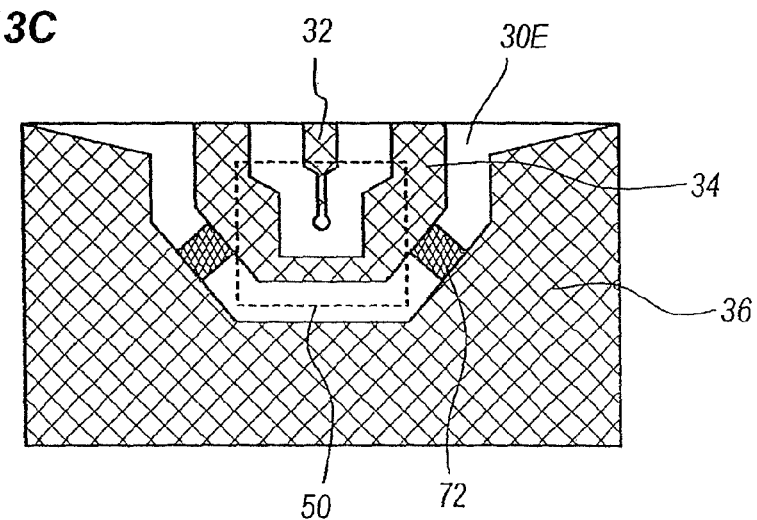

FIG. 13C shows still another carrier 30E. Comparing with the aforementioned carrier 30B shown in FIG. 9C, the carrier 30E omits the metal film 39 but the third metal film 36 extends to the bottom edge thereof. However, the third metal film 36 is slightly apart from the bottom edge of the carrier 30E so as to be electrically isolated from the base 20. The third metal film 36 of the present embodiment shows the capacitance of about 80 fF against the base 20. Other arrangements of the carrier 30E are substantially same as those 30D shown in FIG. 13B.

FIG. 14A shows the calculated behavior of the trans-impedance $Z_{21}$ of the module implemented with the carrier 30C of FIG. 13A. Resonances substantially vanish in a frequency region of 0 to 50 GHz. Moreover, the flatness below 20 GHz may be maintained. FIG. 14B shows the calculated behavior of the trans-impedance $Z_{21}$ of the module implementing with the carrier 30D of FIG. 13B. Resonances also vanish in a frequency range of 0 to 50 GHz. Moreover, the flatness below 20 GHz may be also maintained. FIG. 14C shows a behavior of the trans-impedance $Z_{21}$ of the module implemented with the carrier 30E of FIG. 13C. Resonances also vanish in the range of 0 to 50 GHz, and the flatness below 20 GHz may be maintained.

FIG. 14D shows a calculated behavior of the trans-impedance $Z_{21}$ of the module 1A, where FIG. 14D assumes an arrangement where a capacitor with capacitance of 500 fF is connected between the film resistor 72 and the base 20; that is, the capacitor C3 shown in FIG. 10 has the capacitance of 500 fF. As evaluated in FIG. 12B, the resonance appeared around 32 GHz may fully vanish by setting the capacitance of the capacitor C3 over 500 fF.

Figure 15:
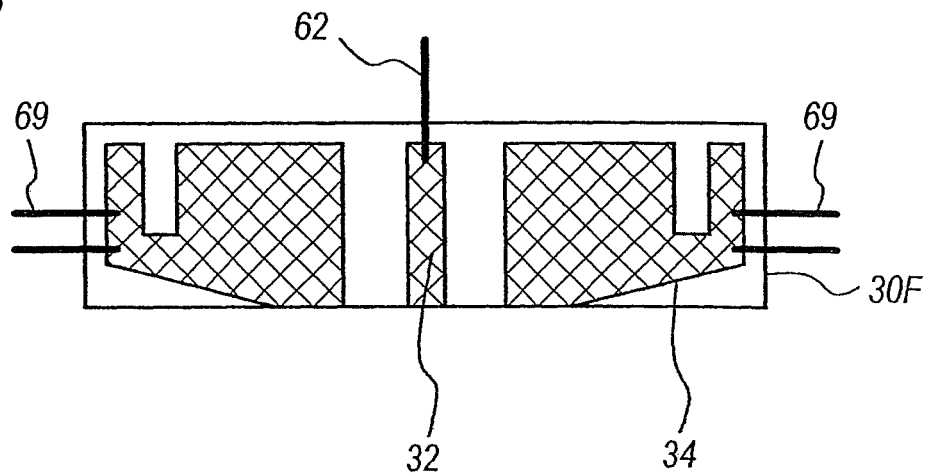
FIG. 15 is a top view showing another modification of the carrier.

FIG. 15 is a top view of still another carrier 30F. The carrier 30F of the present embodiment removes film resistors 75 shown in FIG. 9A that connects the second metal films 34 to the other metal film 38 formed in the top surface of the carrier 30B but, in the modified arrangement of FIG. 15, the inner metal film 34 extends to the outer metal film 38 to be directly connected thereto. The cut formed between the inner metal film 34 and the outer metal film 38 may prevent solder for bonding the die capacitor 64 from oozing out to the outer metal film. Oozed out solder into the outer metal film may impede the process for the bonding wire.

The resistors 75 have a function to isolate the bias supply line, which is the second metal film 34, from the external line in higher frequencies. The second metal film 34 is connected to the external line through the bonding wire 69 and another bonding wire 71 shown in FIGS. 9A to 10, the isolation may be performed by these bonding wires, 69 and 71. Accordingly, the resistors 75 may be removed from the top of the carrier 30F.

Figure 16:
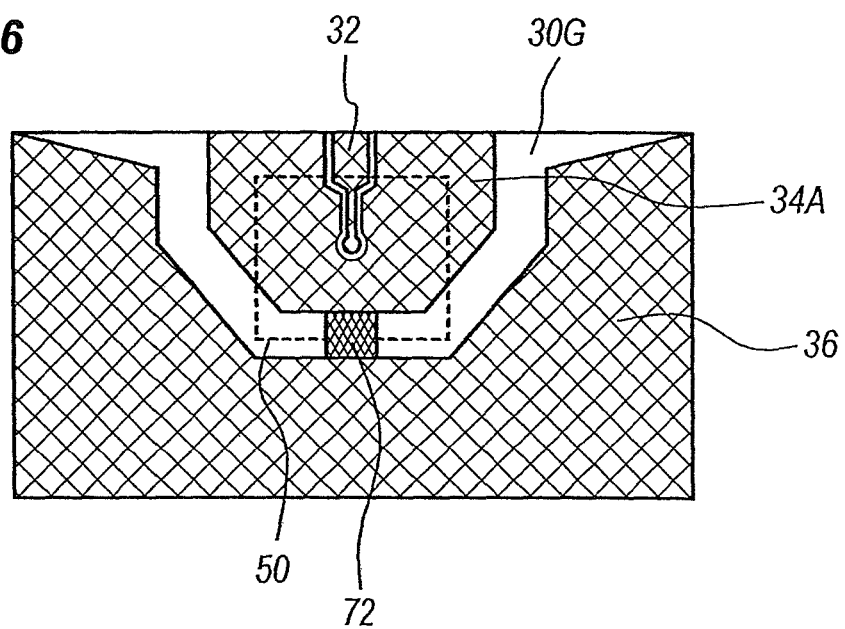
FIG. 16 is a front view showing still another modification of the carrier.

FIG. 16 is a front view showing still another carrier 30G which is modified from the carrier 30C shown in FIG. 13A. The carrier 30G has the same arrangement for the metal film 36 with those of the aforementioned carrier 30C but it has different arrangements in the metal film 34A surrounding the first metal film 32. That is, the aforementioned arrangement of FIG. 13A has a substantial space between the second metal film 34 and the first metal film 32; however, the metal film 34A of the present embodiment makes a narrower space against the first metal film 32. The space between metal films, 34A and 32, is substantially equal to or narrower than the minimum width of the metal film 32.

The arrangement of the carrier 30G shown in FIG. 16 not only increases the capacitance attributed to the metal film 34 but also increases the capacitance between the metal films, 32 and 34, which may be reflected in a capacitor put between the anode and the cathode of the PD 10. The capacitor thus added to the PD 10 may couple the second metal film 34 with the first metal film 32, and reduce the impedance of the signal line 32 viewed from the anode of the PD 10 toward the input of the TIA 14, which may stable the operation of the TIA 14.

Embodiments according to the present invention supplies the bias supply Vpd to one terminal (cathode) of the PD 10, while, the TIA 14 may receive a photocurrent generated by the PD 10 from another terminal (anode) of the PD 10 through the bonding wire 62. The second metal film 34, which is formed on the surface of the carrier, 30C to 30G, is connected with the terminal (cathode) of the PD 10 to form stray capacitor C2 against the base 20. The third metal film 36, which is also formed on the surface of the carrier, 30C to 30G, constitutes another stray capacitor C3 against the base 20. The frequency characteristic of the trans-impedance $Z_{21}$ of the front end module 1A may be stable by connecting the second metal film 34 with the third metal film 36 by the resistor R3 which is also formed on the carrier, 30C to 30G.

The arrangements realized in aforementioned embodiments may effectively suppress, or substantially vanish resonances appeared in the trans-impedance $Z_{21}$ in high frequencies exceeding 30 GHz without disturbing the flatness thereof in lower frequencies. Because the second and third metal films, 34 and 36, are formed on the surface of the carrier, 30 to 30G, the parasitic inductance thereof may be ignorable compared with those of the bonding wire. When a coupling capacitor for the bias supply Vpd is externally installed, the inductance attributed to a bonding wire extended to such external capacitor causes degradation of the frequency response of the front end module. The present front end module may install the coupling capacitor adjacent to the PD 10.

The first metal film 32, on which the photocurrent may be carried from the PD 10 to the TIA 12, is formed on the surface of the carrier, 30C to 30G and surrounded by the second metal film 34. This arrangement may effectively shield the first metal film 32 by the second metal film 34, which may suppress, or substantially remove the resonances appeared in the trans-impedance $Z_{21}$ appeared in low frequencies.

The third metal film 36 may be divided into two parts, 36-1 and 36-2, as shown in FIG. 13B; and a resistor 72-1 may connect the second metal film 34 with one of the third metal film 36-1, while, the other resistor 72-2 may connect the second metal film 34 with the other of the third metal film 36-2. This arrangement may not only suppress, or substantially remove the resonances of the trans-impedance $Z_{21}$ in the lower frequency region by putting the second metal film 34 between two third metal films, 36-1 and 36-2; but may reduce the resonances in a higher frequency region over 30 GHz.

The capacitance C3 attributed to the third metal film 36 is preferable to be greater than the capacitance C2 attributed to the first metal film 34 in order to suppress the resonances of the trans-impedance appeared in the higher frequency region. The capacitance of the capacitors, C2 and C3, each attributed to the metal film, 32 and 34, depends on an area of the metal film, 32 and 34; accordingly, the third metal film 36 preferably has a surface area wider than the area of the second metal film 34.

When the third metal film 36 is divided into two parts, at least one of the divided third metal films preferably has an area wider than the second metal film 34. More preferably, both of the divided third metal films, 36-1 and 36-2, preferably have the area wider than that of the second metal film 34 to suppress or substantially remove the resonances of the trans-impedance $Z_{21}$ appeared in the higher frequency region over 30 GHz.

The arrangement according to the embodiments sets the die capacitor C4 on the second metal film 34 in the top of the carrier 30C; while, the top surface of the die capacitor C4, which is one of electrodes thereof, is connected to the ground GND of the IC 40 through bonding wires 63. Moreover, the second metal film 34 is connected to the bias supply through the resistor R4 and the bonding wires, 69 and 71, which equivalently constitutes a filtering circuit. Thus, the coupling capacitor C4 for the bias supply Vpd may be placed just adjacent to the PD chip 50, which may remove the resonances of the trans-impedance $Z_{21}$.

The first resistor R3 connecting the second metal film 34 with the third metal film 36 may have an arrangement of a chip resistor; but, preferably has an arrangement of a thin film resistor formed on the surface of the carrier, 30C to 30G, to suppress degradation of the performance of the front end module 1A in the higher frequency region.

Similarly, the third resistor R4 connecting the outer metal film 38 with the second metal film 34 in the top of the carrier, 30C to 30G, may have an arrangement of the chip resistor; but, preferably has the arrangement of the thin film resistor to suppress degradation of the high frequency performance of the front end module 1.

Although the present invention has been fully described in conjunction with the embodiments thereof as referring to the accompanying drawings, it is to be understood that various changes and modifications may be apparent to those skilled in the art. Such changes and modifications are to be understood as included within the scope of the present invention as defined by the appended claims.

What is claimed is:

1. A front end module for an optical receiver, comprising:
   a light-receiving device that generates a photocurrent provided with a bias supply;
   a trans-impedance amplifier that receives the photocurrent from the light-receiving device through a first bonding wire, the trans-impedance amplifier providing a ground;
   a carrier made of electrically insulating material, the carrier including a first metal film, a second metal film, and a third metal film, the first metal film connecting the light-receiving device with the first bonding wire to carry the photocurrent thereon, the second metal film surrounding the first metal film and carrying the bias supply to the light-receiving device, the third metal film arranged outside of the second metal film with respect to the first metal film, the first metal film and the second metal film mounting the light-receiving device in an arrangement of a flip-chip bonding; and
   an electrically conductive base that mounts the carrier and the trans-impedance amplifier thereon,
   wherein the third metal film is connected with the second metal film through a resistor to constitute a series circuit of the resistor and a capacitor attributed to the third metal film against the base.

2. The front end module of claim 1,
   further comprising two die capacitors each mounted on the second metal film in positions putting the first metal film therebetween, the die capacitors each connected with the ground through a second bonding wire,
   wherein the second bonding wires connected to respective die capacitors put the first bonding wire therebetween.

3. The front end module of claim 1,
   wherein the resistor has an arrangement of a thin film resistor.

4. The front end module of claim 1,
   wherein the third metal film has a parasitic capacitance against the base greater than a parasitic capacitance attributed to the second metal film against the base.

5. The front end module of claim 1,
   wherein the third metal film has two portions each formed on the surface of the carrier and the resistor has two film resistors, one of film resistors connecting one of portions of the third metal film with the second metal film, another film resistor connecting another portion of the third metal film with the second metal,
   wherein each portions of the third metal film put the second metal film therebetween.

6. The front end module of claim 5,
   wherein at least one of portions of the third metal film has a parasitic capacitance against the base greater than a capacitance attributed to the second metal film against the base.

7. The front end module of claim 1,
   wherein the carrier further has a fourth metal film formed on the surface thereof and another resistor connecting the fourth metal film with the second metal film,
   wherein the second metal film and the fourth metal film each has a parasitic capacitance against the base, and
   wherein the light-receiving device is provided with the bias supply through the fourth metal film, the other resistor, and the second metal film.

8. The front end module of claim 7,
   further comprising a sub-base made of electrically conducting material and another die capacitor mounted on the sub-base,
   wherein the light-receiving device is provided with the bias supply through the other die capacitor, a bonding wire connecting the other die capacitor with the fourth metal film, the other resistor, and the second metal film.

9. The front end module of claim 1,
   wherein the second metal film forms a gap against the first metal film narrower than a minimum width of the first metal film.

10. A front end module for an optical receiver, comprising:
    a photodiode for outputting a photocurrent in an anode electrode thereof biased with a bias supply in a cathode electrode thereof;
    a trans-impedance amplifier for receiving the photocurrent, the trans-impedance amplifier having a signal ground;
    an insulating carrier having a first metal film, a second metal film, and a third metal film, the first metal film carrying the photocurrent from the photodiode to the trans-impedance amplifier, the second metal film supplying the bias supply to the photodiode and surrounding the first metal film, the third metal film being put outside of the second metal film with respect to the first metal film and floating from the signal ground, the photodiode being mounted on the first metal film and the second metal film in a front surface of the insulating carrier by a flip-chip arrangement; and
    an electrically conductive base for mounting the insulating carrier and the trans-impedance amplifier thereon, the base providing the signal ground,
    wherein the carrier further includes a thin film resistor connecting the third metal film to the second metal film to form a series circuit of the thin film resistor and a capacitor attributed to the third metal film against the base between the second metal film and the signal ground.

11. The frond end module of claim 10,
wherein the base includes a front step accompanied with a top and a bottom, the top mounting the trans-impedance amplifier thereon and the bottom mounting the carrier thereon.

12. The frond end module of claim 11,
wherein the carrier shapes a rectangular block including a top surface and a front surface, the first metal film and the second metal film extending from the top surface to the front surface, the third metal film and the thin film resistor being formed in the front surface, the photodiode being mounted on the front surface.

13. The frond end module of claim 12,
wherein the second metal film is divided into two parts putting the first metal film in the top surface of the carrier.

14. The front end module of claim 13,
wherein each parts of the second metal film in the top surface of the carrier mounts a die capacitor wire-bonded to the signal ground of the trans-impedance amplifier.

15. The front end module of claim 10,
wherein the third metal film has parasitic capacitance greater than parasitic capacitance attributed to the second metal film against the base.

16. The front end module of claim 10,
wherein the third metal film is divided into two parts, and the thin film resistor has two elements, one of elements connecting one of parts of the third metal film with the second metal film and the other of elements connecting another parts of the third metal film with the second metal film,
wherein at least one of parts of the third metal film has parasitic capacitance against the base greater than parasitic capacitance attributed to the second metal film against the base.

17. The front end module of claim 10,
wherein the second metal film forms a gap against the first metal film narrower than a minimum width of the first metal film.

* * * * *